US006946697B2

(12) United States Patent
Pietambaram et al.

(10) Patent No.: US 6,946,697 B2
(45) Date of Patent: Sep. 20, 2005

(54) SYNTHETIC ANTIFERROMAGNET STRUCTURES FOR USE IN MTJS IN MRAM TECHNOLOGY

(75) Inventors: Srinivas V. Pietambaram, Chandler, AZ (US); Renu W. Dave, Chandler, AZ (US); Jon M. Slaughter, Tempe, AZ (US); Jijun Sun, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 18 days.

(21) Appl. No.: 10/740,338

(22) Filed: Dec. 18, 2003

(65) Prior Publication Data

US 2005/0133840 A1    Jun. 23, 2005

(51) Int. Cl.[7] .............................................. H01L 29/76
(52) U.S. Cl. ...................... 257/295; 257/421; 365/158; 365/171; 365/173
(58) Field of Search ........................ 257/421; 365/158, 365/171, 173

(56) References Cited

U.S. PATENT DOCUMENTS

| 6,197,439 B1 | 3/2001 | Parkin |
| 6,469,926 B1 * | 10/2002 | Chen ........................ 365/158 |
| 6,518,588 B1 | 2/2003 | Parkin |

\* cited by examiner

*Primary Examiner*—David Nelms
*Assistant Examiner*—Mai-Huong Tran
(74) *Attorney, Agent, or Firm*—James L. Clingan, Jr.

(57) ABSTRACT

A magnetic tunnel junction (MTJ), which is useful in magnetoresistive random access memories (MRAMs), has a free layer which is a synthetic antiferromagnet (SAF) structure. This SAF is composed of two ferromagnetic layers that are separated by a coupling layer. The coupling layer has a base material that is non-magnetic and also other materials that improve thermal endurance, control of the coupling strength of the SAF, and magnetoresistance ratio (MR). The preferred base material is ruthenium and the preferred other material is tantalum. Furthering these benefits, cobalt-iron is added at the interface between the tantalum and one of the ferromagnetic layers. Also the coupling layer can have even more layers and the materials used can vary. Also the coupling layer itself can be an alloy.

22 Claims, 1 Drawing Sheet

US 6,946,697 B2

SYNTHETIC ANTIFERROMAGNET STRUCTURES FOR USE IN MTJS IN MRAM TECHNOLOGY

FIELD OF THE INVENTION

This invention relates to magnetic tunnel junctions (MTJs), and more particularly to MTJs that use synthetic antiferromagnet (SAF) structures for the free layer.

RELATED ART

Magnetoresistive random access memories (MRAMs) are known to have many benefits such as being fast, non-volatile, and high density. There are difficulties, however, in making MRAMs in a manufacturable manner. One of the difficulties that have been addressed is the difficulty with writing the MRAM cells reliably. This has been effectively addressed with a toggle bit which changed both the manner of writing and the structure of the free layer over that previously used. This particular solution typically uses a SAF structure for the free layer. Solving the write problem using the SAF structure for the free layer then changed the considerations required for improving the MRAM bit cell, and more particularly the MTJ portion of the MRAM bit cell. One of the continuing desires with MRAM is to improve the magnetoresistance (MR) ratio, which is the ratio of the change in resistance between the two logic states to that of the low resistance state. Replacing a single free layer with a SAF free layer can reduce the MR. Since the signal available to the sense circuitry is proportional to the MR, an improvement that increases MR in an MTJ having a SAF free layer will result in an improvement in sensing speed. Another issue is the ability to control the antiferromagnetic coupling strength of the free layer SAF. This coupling needs to be controlled so that the current for writing is maintained within an acceptable range. Another issue is endurance, especially thermal endurance. MTJ materials tend to have higher sensitivities to elevated temperatures than the materials used in some semiconductor processes. In particular, SAF materials have a failure mode at elevated temperatures that causes a degradation of the antiferromagnetic coupling strength.

Thus, there is an ongoing need for MRAM development to improve one or more of thermal endurance, MR ratio, and control of the write currents.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect a magnetic tunnel junction (MTJ), which is useful in magnetoresistive random access memories (MRAMs), has a free layer which is a synthetic antiferromagnet (SAF) structure. This SAF is composed of two ferromagnetic layers that are separated by a coupling layer. The coupling layer has a base material that is non-magnetic and also other materials that improve thermal endurance, control of the coupling strength of the SAF, and MR. The preferred base material is ruthenium and the preferred other materials are tantalum and a cobalt-iron alloy. This is better understood by reference to the drawings and the following description.

Figure 1:
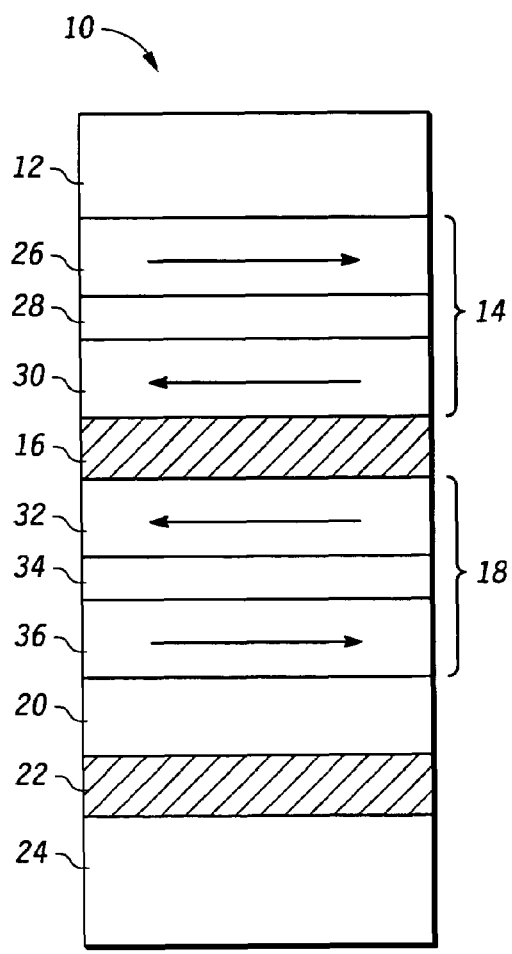
FIG. 1 is a cross section of a magnetic tunnel junction (MTJ) for use in an MRAM according to an embodiment of the invention.

Shown in FIG. 1 is an MTJ 10 comprising a top electrode 12, a free SAF 14 immediately under top electrode 12, a tunnel barrier 16 immediately under SAF 14, a fixed SAF 18 immediately under tunnel barrier 16, a pinning layer 20 immediately under fixed SAF 18, a seed layer 22 immediately under layer 20, and a base electrode 24 immediately under seed layer 22. Free SAF 14 comprises a ferromagnetic layer 26 immediately under top electrode 12, a coupling layer 28 immediately under ferromagnetic layer 26, and a ferromagnetic layer 30 immediately under coupling layer 28. Fixed SAF 18 comprises a ferromagnetic layer 32 immediately under tunnel barrier 16, a coupling layer 34 immediately under ferromagnetic layer 32, and a ferromagnetic layer 36 immediately under coupling layer 34. Ferromagnetic layers 32 and 36 are preferably comprised of alloys that include cobalt and iron. Except that coupling layer 28 comprises a combination of materials, preferably ruthenium and tantalum and ferromagnetic layer 30 preferably includes cobalt and iron at the interface with coupling layer 28, MTJ 10 is known to one of ordinary skill in the art. It is known to those skilled in the art that the fixed SAF 18 can be replaced by other structures that provide a magnetically fixed layer 32 in contact with the tunnel barrier 16, such as a single pinned ferromagnetic layer, such that the magnetic moment vector of the fixed layer 32 does not move substantially in the applied fields used to switch the free layer.

Figure 2:
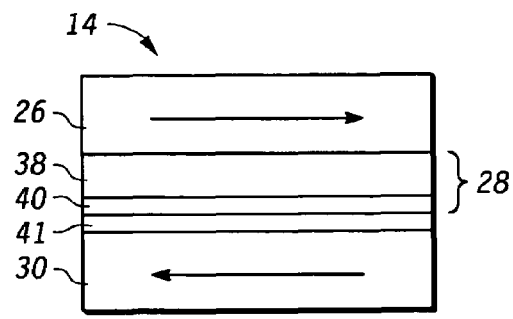
FIG. 2 is a cross section of a portion of the MTJ of FIG. 1 according to the embodiment of the invention.

Shown in FIG. 2 is SAF 14 comprising ferromagnetic layers 26 and 30, an insertion layer 41, and a coupling layer 28 comprised of a base layer 38 immediately under ferromagnetic layer 26 and an insertion layer 40 immediately under base layer 38. Insertion layer 41 is between ferromagnetic layer 30 and insertion layer 40. Insertion layer 41, having the ferromagnetic materials of iron and cobalt, functions magnetically as part of ferromagnetic layer 30. Insertion layer 41 is preferably cobalt iron alloy but may be other materials instead, such as cobalt or iron. Base layer 38 preferably comprises ruthenium but could also comprise another base material such as rhodium, iridium, and osmium. Base material as used herein means a material that itself can be sufficient to provide the needed antiferromagnetic coupling between the two ferromagnetic materials in a SAF. Insertion layer 40 is preferably tantalum and is inserted to improve the properties of SAF 14. Insertion layer 41 is preferably cobalt-iron and is also inserted to improve the properties of SAF 14. Ferromagnetic layers 26 and 30 are preferably nickel-iron alloy with 16 to 20 atomic percent iron, and more preferably about 18 atomic percent iron.

Insertion layer 41 is preferably deposited by ion beam deposition using a cobalt-iron target, but another process could be used. One example of an alternative is magnetron sputtering. This insertion layer 41 is preferably deposited directly on ferromagnetic layer 30. Insertion layer 40 is then deposited directly on insertion layer 41 by ion beam deposition using a tantalum target but another process, such as magnetron sputtering, could also be used. The tolerance is held as tight as possible, but the thickness range of coupling layer 28 can be 6–10 angstroms. Base layer 38 is preferably 6.0 to 6.5 angstroms and insertion layer 40 is preferably deposited to a thickness of 2.5 angstroms. Insertion layer 41 is deposited to a thickness of preferably 2.5 angstroms that is held as tight as possible but the range can be 1.5–5 angstroms. These dimensions are based on using ruthenium as the base material having a coupling peak centered around 7–8 angstroms. Another peak could be used that would significantly affect those dimensions. With insertion layers 40 and 41 being deposited to sub-atomic thicknesses, insertion layers 40 and 41 may appear as a single alloyed layer. Thus, it may be difficult to actually distinguish layers 40 and 41 in a finished MTJ such as MTJ 10.

Base layer 38 provides sufficient coupling between ferromagnetic layers 26 and 30 to achieve antiferromagnetic alignment, and the addition of insertion layers 40 and 41 improves certain characteristics of the resulting SAF 14. For example, one improvement is in the thermal endurance. The temperature at which failure of SAF 14 occurs is higher than if ruthenium alone is used. Another improvement is in the control of coupling strength between ferromagnetic layers 26 and 30. The thickness of base layer 38 is difficult to keep from varying over process variations. The coupling strength varies with this thickness. With insertion layers 40 and 41 added, the rate of change of coupling strength varies less with changes in base layer thickness resulting in increased control of the coupling strength. Yet another improvement is an improvement in the MR ratio of MTJ 10. For example, if the MR ratio prior to the addition of insertion layers 40 and 41 was about 30 percent, then it is observed to increase by 3 percentage points due to the insertion of insertion layers 40 and 41, which is about a 10 percent improvement. There may be circumstances where it would be beneficial to leave off one of the added layers 40 and 41.

Figure 3:
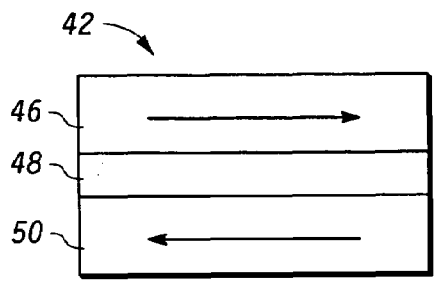
FIG. 3 is a cross section of a portion of the MTJ of FIG. 1 according to an alternative embodiment of that shown in FIG. 2.

Shown in FIG. 3 is an alternative SAF 42 for replacing SAF 14 in FIG. 1. SAF 42 comprises a ferromagnetic layer 46 immediately under top electrode 12, a coupling layer 48 immediately under ferromagnetic layer 46, a ferromagnetic layer 50 immediately under coupling layer 48. In this case coupling layer 48 is an alloy of a base material and another material that improves thermal endurance and control of coupling strength. Examples of the base material are ruthenium, rhodium, iridium, and osmium. The added materials that are added to form an alloy are chosen from boron, aluminum, carbon, tantalum, niobium, molybdenum, zirconium, and hafnium. The preferred combination is ruthenium and boron because it demonstrates better endurance under high temperature annealing compared to a SAF having the same coupling strength achieved with ruthenium alone. Coupling layer 48 is preferably in the range of 6–10 angstroms. Again, these dimensions are based on using ruthenium as the base material having a coupling peak centered around 7–8 angstroms. Another peak could be used that would significantly effect those dimensions.

Figure 4:
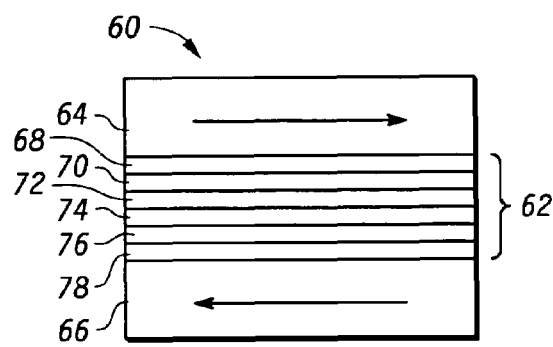
FIG. 4 is a cross section of a portion of the MTJ of FIG. 1 according to another alternative embodiment of that shown in FIG. 2.

Shown in FIG. 4 is another alternative SAF 60 for substitution with SAF 14 of FIG. 1. SAF 60 comprises ferromagnetic layer 64 immediately under top electrode 12, a coupling layer 62 immediately under ferromagnetic layer 64, and a ferromagnetic layer 66 immediately under coupling layer 62. In this case coupling layer 62 is a composite of multilayers comprising layer 78 on ferromagnetic layer 66, layer 76 on layer 78, layer 74 on layer 76, layer 72 on layer 74, layer 70 on layer 72, and layer 68 on layer 70. This multilayer configuration is alternating base material and added materials to improve characteristics of SAF 60 and thus MTJ 10. In these layers 68, 72, and 76 are base material and layers 70, 74 and 78 are added materials. This is an example of six layers but there could be fewer or more. Added materials may be one of nickel-iron, cobalt-iron, tantalum, and aluminum. These have been shown to provide the benefit of control of the coupling strength. The total thickness of coupling layer 62 should be in the range of 6–10 angstroms. In this example of 6 layers, each of layers 68–78 should be in the range of 1–1.7 angstroms to achieve the desired thickness for coupling layer 62. At these small dimensions it may be difficult to discern the individual layers. This multilayer approach has been shown to give more control in selecting the coupling strength. The preferred materials are ruthenium for the base material and tantalum as the added material.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A magnetic tunnel junction (MTJ), comprising:
  a first electrode and a second electrode;
  a tunnel barrier between the first and second electrodes;
  a free synthetic antiferromagnet (SAF) between the first electrode and the tunnel barrier;
  a fixed layer between the tunnel barrier and the second electrode;
  wherein the free SAF comprises:
    a first layer and a second layer, wherein the first and second layers are ferromagnetic;
    a third layer between the first and second layers, wherein the third layer comprises a base material;
    a fourth layer between the third layer and the second layer, wherein the fourth layer comprises tantalum.

2. The MTJ of claim 1, further comprising a fifth layer between the fourth and the second layer, wherein the fifth layer comprises a ferromagnetic material different from that used to form the second layer.

3. The MTJ of claim 2, wherein the fifth layer comprises at least one of cobalt and iron.

4. The MTJ of claim 3, wherein the fourth layer and the fifth layer are substantially merged.

5. The MTJ of claim 1, wherein the base material comprises ruthenium.

6. An MTJ, comprising:
a first electrode and a second electrode;
a tunnel barrier between the first and second electrodes;
a free synthetic antiferromagnet (SAF) between the first electrode and the tunnel barrier;
a fixed layer between the tunnel barrier and the second electrode;
wherein the free SAF comprises:
  a first layer and a second layer, wherein the first and second layers are ferromagnetic;
  a third layer between the first and second layers, wherein the third layer comprises first material and a second material wherein the first material is one of ruthenium, rhodium, iridium, and osmium and the second material is one of boron, aluminum, carbon, tantalum, niobium, molybdenum, zirconium, and hafnium.

7. The MTJ of claim 6, wherein the first material and the second material form an alloy.

8. The MTJ of claim 7, wherein the first material comprises ruthenium and the second material comprises one of tantalum and boron.

9. The MTJ of claim 8, wherein the second material is boron.

10. The MTJ of claim 6, wherein the third layer comprises a fourth layer of the first material and a fifth layer of the second material.

11. The MTJ of claim 10, wherein the fourth layer comprises ruthenium and the fifth layer comprises tantalum.

12. The MTJ of claim 11, wherein the fifth layer further comprises at least one of cobalt and iron.

13. The MTJ of claim 11, wherein, the fourth layer is between the fifth layer and the first layer, and further comprising a sixth layer of the first material between the fifth layer and the second layer.

14. The MTJ of claim 13, further comprising a seventh layer of the second material between the sixth layer and the second layer.

15. An MTJ, comprising:
a first electrode and a second electrode;
a tunnel barrier between the first and second electrodes;
a free synthetic antiferromagnet (SAF) between the first electrode and the tunnel barrier;
a fixed layer between the tunnel barrier and the second electrode;
wherein the free SAF comprises:
  a first layer and a second layer, wherein the first and second layers are ferromagnetic;
  a third layer of a first material between the first and second layers, wherein the first material is a base material;
  a fourth layer of a second material between the third layer and the second layer, wherein the second material is selected from nickel-iron, cobalt-iron, tantalum, and aluminum; and
  a fifth layer of the first material between the fourth layer and the second layer.

16. The MTJ of claim 15, further comprising:
a sixth layer of the second material between the fifth layer and the second layer; and
a seventh layer of the first material between the sixth layer and the second layer.

17. The MTJ of claim 15, wherein the second material comprises at least one of nickel and iron.

18. The MTJ of claim 15, wherein the second material comprises at least one of cobalt and iron.

19. The MTJ of claim 15, wherein the first layer comprises a nickel-iron alloy.

20. The MTJ of claim 19, wherein the nickel-iron alloy is about 16 to 20 atomic percent iron.

21. The MTJ of claim 20, wherein the second ferromagnetic layer comprises nickel iron that is about 18 atomic percent iron.

22. A magnetic tunnel junction (MTJ), comprising:
a first electrode and a second electrode;
a tunnel barrier between the first and second electrodes;
a free synthetic antiferromagnet (SAF) between the first electrode and the tunnel barrier;
a fixed layer between the tunnel barrier and the second electrode;
wherein the free SAF comprises:
  a first layer and a second layer, wherein the first and second layers are ferromagnetic;
  a third layer between the first and second layers, wherein the third layer comprises a base material;
  a fourth layer that is conductive between the third layer and the second layer; and
  a fifth layer between the fourth layer and the second layer, wherein the fifth layer comprises at least one of cobalt and iron.

* * * * *